United States Patent [19]

Nickerson

[11] Patent Number: 5,121,052
[45] Date of Patent: Jun. 9, 1992

[54] AUTOMATED HANDLER FOR SEMICONDUCTOR DEVICES

[75] Inventor: Larry A. Nickerson, Mesa, Ariz.

[73] Assignee: Motorola Inc., Schaumburg, Ill.

[21] Appl. No.: 642,774

[22] Filed: Jan. 18, 1991

[51] Int. Cl.⁵ .......................... G01R 1/00; G01R 1/02
[52] U.S. Cl. ............................ 324/158 F; 324/158 P; 209/573; 198/474.1
[58] Field of Search ........................ 324/158 F, 158 P; 198/474.1, 478 P; 414/223, 224; 901/6; 209/573

[56] References Cited

U.S. PATENT DOCUMENTS

| | | | |
|---|---|---|---|
| 3,980,553 | 9/1976 | Quinn | 209/573 |
| 4,738,348 | 4/1988 | Sillner | 209/573 |
| 4,747,928 | 5/1988 | Takahashi et al. | 198/474.1 |
| 4,790,438 | 12/1988 | Wilhelm | 209/573 |
| 4,858,479 | 8/1989 | Voss et al. | 324/158 F |

FOREIGN PATENT DOCUMENTS

| | | | |
|---|---|---|---|
| 0228351 | 7/1987 | European Pat. Off. | 198/478.1 |
| 1069070 | 11/1959 | Fed. Rep. of Germany | 198/474.1 |
| 0271073 | 8/1989 | Fed. Rep. of Germany | 414/223 |
| 0098375 | 7/1980 | Japan | 324/158 F |
| 0064748 | 3/1989 | Japan | 414/223 |
| 0132971 | 5/1989 | Japan | 324/158 F |
| 0195273 | 8/1990 | Japan | 324/158 F |
| 0477566 | 11/1975 | U.S.S.R. | 324/158 F |
| 0197712 | 12/1977 | U.S.S.R. | |

*Primary Examiner*—Kenneth A. Wieder
*Assistant Examiner*—William J. Burns
*Attorney, Agent, or Firm*—Joe E. Barbee

[57] ABSTRACT

A handler for semiconductor devices has a positioning wheel with a number of platforms that hold semiconductor devices, a mechanism for rotating the positioning wheel, and a mechanism for elevating and lowering the platforms. A semiconductor device is inserted into one of the platforms, the positioning wheel rotates until the platform is aligned with the leads of a semiconductor device tester. The platform is then raised placing the leads of the tester in contact with the semiconductor device. After testing is complete, the platform is lowered to the surface of the wheel and the wheel is rotated further to align the platform with an apparatus for storing semiconductor devices. The tested semiconductor device is ejected from the platform into the sorting apparatus.

13 Claims, 2 Drawing Sheets

AUTOMATED HANDLER FOR SEMICONDUCTOR DEVICES

BACKGROUND OF THE INVENTION

The present invention relates, in general, to the automated handling, manipulation, and positioning of semiconductor devices, and more particularly, to a novel automated handler for packaged semiconductor devices.

Handlers had long been used by the semiconductor industry to automate the handling and manipulation of semiconductor devices during various stages of their manufacturing. One of the applications for handlers was to automate the movements required to place semiconductor devices in contact with a tester and to subsequently place the tested devices into a sorter. Previous handlers for this application generally accomplished movement of the semiconductor device by a pick and place method which used a vacuum apparatus to hold the device. An arm, which pivoted on one or more axes, was attached to the vacuum apparatus and provided movement. Pick and place equipment had a large range of movement which generally limited the cycle rate of such equipment to less than 1200 parts per hour, while a desirable cycle rate was approximately 7000 to 10,000 parts per hour. Consequently, several pick and place units were utilized to attain the desired cycle rate, thereby, increasing cost required to automate an operation at the desired cycle rate. Additionally, each pick and place unit was expensive which further increased the cost to automate an operation and approach the desired cycle rate.

Accordingly, it is desirable to have a handler for semiconductor devices that can operate at an increased cycle rate, and to have a handler for semiconductor devices that has a low cost.

SUMMARY OF THE INVENTION

Briefly stated, the present invention is achieved by creating a handler for semiconductor devices wherein the handler has a positioning wheel with a number of platforms that hold semiconductor devices, a means for rotating the positioning wheel, and a means for elevating and lowering the platforms. A semiconductor device is inserted into one of the platforms, the positioning wheel rotates until the platform is aligned with the leads of a semiconductor device tester. The platform is then raised placing the leads of the tester in contact with the semiconductor device. After testing is complete, the platform is lowered to the surface of the wheel and the wheel is rotated further to align the platform with an apparatus for sorting semiconductor devices. The tested semiconductor device is ejected from the platform into the sorting apparatus.

DETAILED DESCRIPTION OF THE DRAWINGS

The present invention provides a semiconductor device handler that includes a positioning wheel, a plurality of platforms on the wheel, and an actuator mechanism. Rotary motion of the wheel is utilized to place semiconductor devices into desired positions, the platforms that are on the wheel hold the semiconductor devices during the movements of the wheel, and the actuator mechanism elevates and lowers a desired platform to place the semiconductor devices into predetermined positions.

While the invention is described with specific preferred embodiments, it is evident that many alternatives and variations will be apparent to those skilled in the art. More specifically, the invention has been described with a particular platform structure, a particular actuator mechanism, and a particular packaged semiconductor device having a carrier ring structure, although the method is directly applicable to other semiconductor devices, as well as to other platform structures and other actuator mechanisms.

Figure 1:
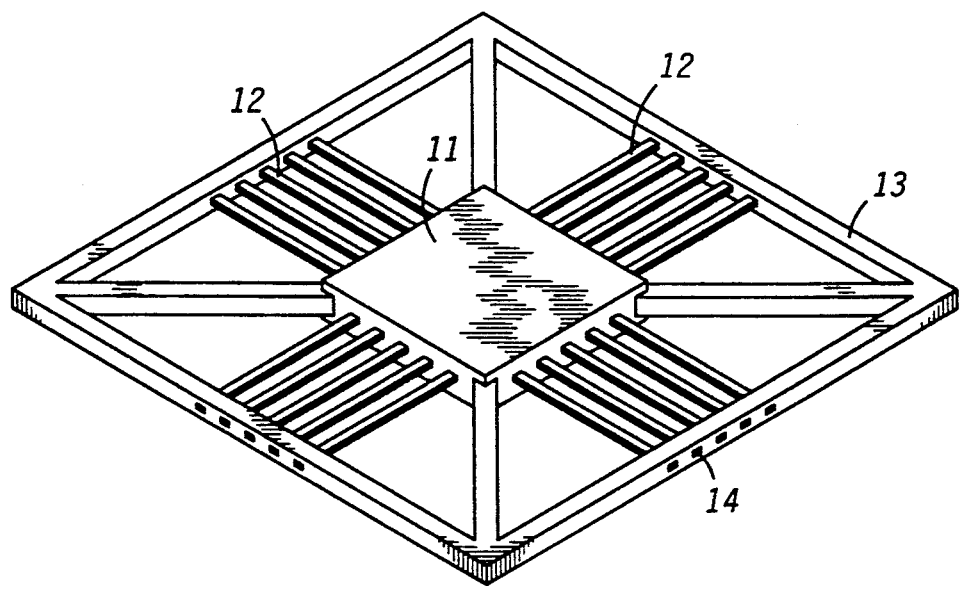
FIG. 1 is an enlarged perspective view of an example of a semiconductor device suitable for use with the invention.

FIG. 1 illustrates an example of a semiconductor device or package 10 that is suitable for use with the present invention. Package 10 includes an encapsulated semiconductor die 11, leads 12, a carrier ring 13 that protects leads 12, and distal lead ends 14 which are exposed along the outer surfaces of carrier ring 13.

Figure 3:
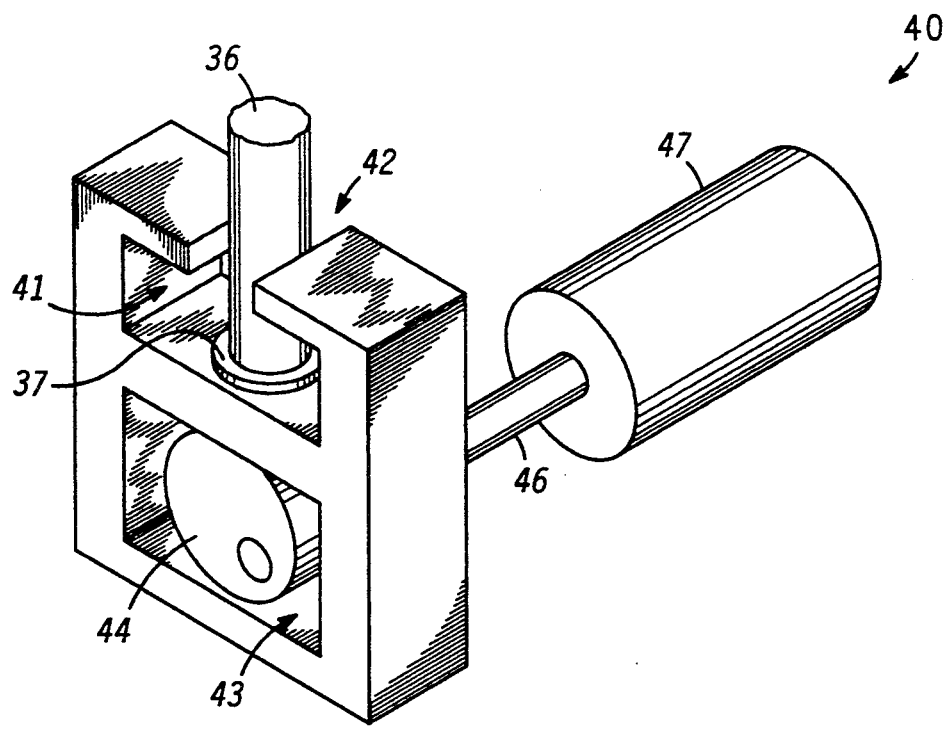
FIG. 3 is a perspective view of an embodiment of an actuator portion of a semiconductor device handler in accordance with the present invention.
Figure 2:
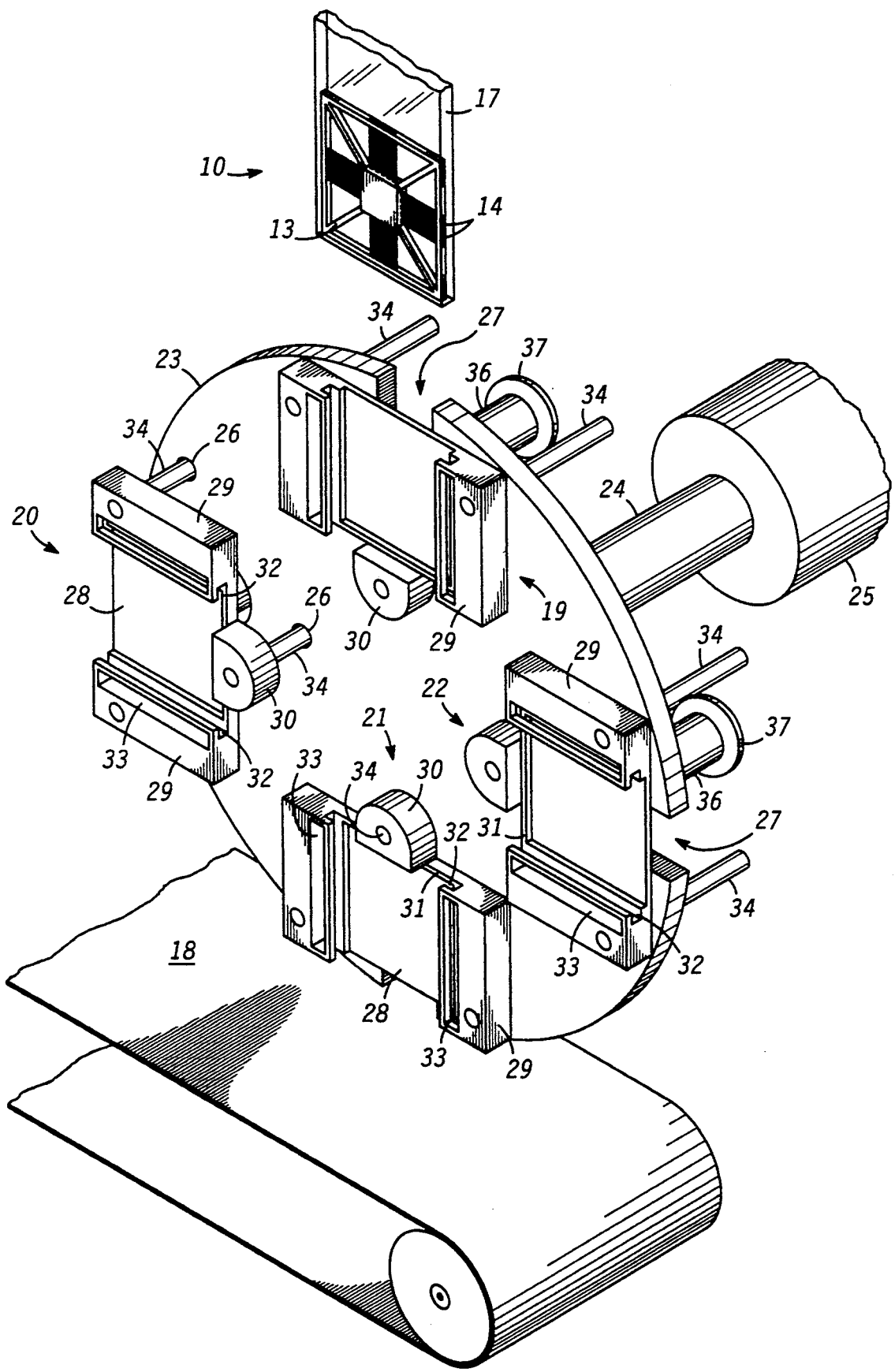
FIG. 2 is a perspective view of an embodiment of a portion of a semiconductor device handler in accordance with the present invention.

Referring to FIG. 2, the present invention includes a positioning wheel 23, a means for rotating wheel 23 about the center of wheel 23, platforms 19, 20, 21, and 22 which are on a surface of wheel 23 and are used for holding semiconductor devices or packages during operations of the handler, and a means for elevating that is used for elevating and lowering platforms 19, 20, 21, and 22. In FIG. 2, the means for elevating is located beneath platform 20 and is hidden by wheel 23, therefore, an embodiment of the means for elevating is illustrated in FIG. 3, and will be discussed hereinafter.

A clear plastic sleeve 17 contains a number of packages 10 which are to be removed from sleeve 17, placed in electrical contact with a semiconductor device tester (not shown), and then transferred to a sorting apparatus 18. Sleeve 17 is held in a vertical position that allows package 10 to fall from sleeve 17 causing package 10 to be inserted into platform 19. After package 10 is inserted into platform 19, wheel 23 is rotated thereby moving platform 19 to the location on wheel 23 that is shown by platform 20. After wheel 23 has stopped, platform 19, now on the surface of wheel 23 at the location shown by platform 20, is elevated from the surface of wheel 23 causing package 10 to be placed in electrical contact with the leads of a semiconductor tester (not shown). The elevating is accomplished by the means for elevating (not shown) such as described in FIG. 3. After testing has been completed, platform 19, at the location shown by platform 20, is lowered back to the surface of wheel 23 and wheel 23 is again rotated until platform 19 is at the location shown by platform 21. At this location, package 10 is ejected and transferred to sorting apparatus 18. In the preferred embodiment, package 10 is ejected by gravity. After package 10 is ejected, wheel 23 again rotates to place platform 19 at the location shown by platform 22. After one more rotation of wheel 23, a revolution is complete and platform 19 is at the location shown by platform 19.

As platform 19 was rotated to the location shown by platform 20, platforms 20, 21, and 22 were also rotating into new locations. Rotating the platforms from one location to another, always presents a new platform at a location ready to be utilized in performing the function of the location. Consequently, each rotation of wheel 23 presents a new platform at the location shown by platform 19 ready to accept a package from sleeve 17, also a platform holding a package is presented at the location shown by platform 20, etc. This rotational replacement action continues for each rotation of wheel 23 thereby maximizing the utilization of each platform and performing multiple operations in parallel to increase the cycle rate of the handler.

Rotation of positioning wheel 23 is accomplished by a means for rotating wheel 23 about its center. In the preferred embodiment, means for rotating wheel 23 includes a motor 25 and a shaft 24 that has one end attached to the center of positioning wheel 23 and another end attached to motor 25. Electronic controls are utilized to rotate motor 25 to predetermined positions. In this preferred embodiment, motor 25 and shaft or axle 24 are secured to a frame or other means of mechanical support. Wheel 23 and axle 24 can be formed of any suitable material that is dimensionally stable and has sufficient strength to withstand the forces which are applied to them. In the preferred embodiment, wheel 23 is plastic and axle 24 is stainless steel.

Platforms 19, 20, 21, and 22 can have various configurations which are determined primarily by the shape of the package to be held by the platform, the means for elevating the platform, and the means for inserting and removing packages from the platform. The number of platforms on wheel 23 can also vary and depends on various parameters including the size and rotational speed of wheel 23. The platforms should be formed of a non-conducting material having sufficient strength to withstand the forces applied during the handler's operations.

In the preferred embodiment, platforms 19, 20, 21, and 22 are constructed to be used with package 10 that has carrier ring 13. To simplify the explanation of platforms 19, 20, 21, and 22, platform 21 will be described although it is understood that platforms 19, 20, 21, and 22 are essentially identical. Platform 21 is formed of a plastic material and includes a base 28, two sides 29 that are on opposite edges of base 28 and are perpendicular to base 28, a back 30, and a front that is open to expose the interior of platform 21. Each side 29 has a slot 32 into which a side of carrier ring 13 is inserted. Slot 32 is formed in the side wall of side 29 that faces the interior of platform 21, has a center line that is parallel to the edge of base 28 on which side 29 is attached, and is displaced perpendicular to base 28 by an amount that is at least equal to the thickness of package 10. A contact opening 33 begins in a top portion of each side 29 near the edge that is adjacent to base 28, and continues through side 29 until it intersects slot 32. When package 10 is inserted into slot 32, distal lead ends 14 are exposed through contact opening 33. Contact opening 33 has a width that is sufficient to permit the leads of a semiconductor tester to enter contact opening 33 and contact distal lead ends 14. Back 30 has a stop 31 that is adjacent to and parallel to the back edge of base 28. Stop 31 has a height that is slightly higher than the lowest edge of slot 32. When package 10 is inserted into platform 21, stop 31 abuts carrier ring 13 thereby providing a space between distal lead ends 14 and back 30. The space is sufficient to allow the leads of a semiconductor tester to be placed between carrier ring 13 and back 30 thereby permitting contact between the leads of the tester and distal lead ends 14. Alternately, back 30 and stop 31 could be replaced with another side 29 thereby producing a platform having three sides 29 and a front that is open. Platform 21 also has three guide pins 34 that function as guides while platform 21 is elevated and lowered, as shown by platform 20. Each guide pin 34 is a metal pin that is pressed into platform 21 and projects perpendicularly from base 28 through a hole 26 in positioning wheel 23. Guide pin 34 has a length that is longer than the distance platform 21 will be raised. Alternately, guide pin 34 could be a metal pin that is pressed into wheel 23 and projects through a hole in platform 21. A stud 36 also projects perpendicularly from base 28 through an opening 27 in positioning wheel 23. A disk shaped foot 37 that has a diameter which is larger than the diameter of stud 36 is attached to the distal end of stud 36. Stud 36 and foot 37 form a means for engaging that couples to the means for elevating thereby engaging platform 21 with the means for elevating allowing it to elevate and lower platform 21 as required.

FIG. 3 illustrates the preferred embodiment of the means for elevating that is used to elevate a platform and return the platform to the surface of wheel 23 as referenced in FIG. 2. In this preferred embodiment, means for elevating includes an actuator 40, an eccentric wheel 44, a motor 47, and a shaft 46. A rectangular opening 41 through actuator 40 is located near a side of actuator 40. Opening 41 has a slot 42 through the side of opening 41 that is nearest the side of actuator 40. Slot 42 is positioned with the center line of slot 42 in the plane of the center line of opening 41. As wheel 23 of FIG. 2 rotates a platform into the location shown by platform 20 of FIG. 2, foot 37 enters opening 41 and stud 36 enters slot 42. An opening 43 through actuator 40 also has a center line that is in the plane of the center line of opening 41 and the center line of slot 42. Eccentric wheel 44, positioned inside of opening 43, is attached to motor 47 by shaft or axle 46. Motor 47 is attached to the same frame or other means for support to which motor 25, referenced in FIG. 2, is attached. As the eccentric actuated drive of motor 47, axle 46, and eccentric wheel 44 causes eccentric wheel 44 to rotate inside of opening 43, actuator 40 pushes foot 37 toward wheel 23 and then pulls foot 37 away from wheel 23 thereby raising and then lowering a platform such as platform 20 shown in FIG. 2.

By now it should be appreciated that there has been provided a novel way to provide an automated handler of semiconductor devices. The rotary replacement action employed by the handler increases its' cycle rate and permits multiple operations to be performed in parallel. The simple construction of the handler along with the simple drive mechanisms permit the tester to have a low cost even though it has a high cycle rate. The handler is flexible and a variety of different package types can be accommodated by employing different platforms.

I claim:

1. An automated handler of semiconductor devices which comprises:

a positioning wheel;

an axle having a first end connected to the positioning wheel and a second end connected to a motor;

a plurality of platforms on the positioning wheel wherein the plurality of platforms hold the devices;

a means for engaging attached to the plurality of platforms;

a means for elevating that couples to the means for engaging to elevate and lower the platforms coplanarly to the positioning wheel wherein the positioning wheel is stationary while the platforms are elevated and lowered has been inserted, to distinguish over the prior art; and a means for ejecting the devices from the plurality platforms.

2. The handler of claim 1 further including a plurality of guide pins attached to the positioning wheel to guide the plurality of platforms as they are raised and lowered.

3. The handler of claim 1 further including a plurality of guide pins attached to the plurality of platforms to guide the plurality of platforms as they are raised and lowered.

4. The handler of claim 1 wherein the means for engaging includes a stud projecting perpendicularly from each platform through the positioning wheel and a disk shaped foot attached to a distal end of the stud.

5. The handler of claim 1 wherein the means for elevating includes an actuator having an eccentric operated drive wherein the actuator is coupled to the means for engaging.

6. An automated handler for packaged semiconductor devices which places the devices in electrical contact with a tester and places the devices in a sorter which comprises:

a positioning wheel;

a means for rotating attached to a first surface of the positioning wheel;

a plurality of platforms for holding the devices wherein the platforms are on a second surface of the positioning wheel;

a stud projecting perpendicularly from each platform through an opening in the positioning wheel;

a disk shaped foot attached to each distal stud end wherein the foot has a larger diameter than the stud;

an actuator having a first opening through the actuator and a slot in one side of the first opening wherein the first opening and the slot are used to grasp the foot while elevating the platform, and lowering the platform; and an eccentric actuated drive in a second opening of the actuator.

7. The handler of claim 6 wherein the means for rotating includes an axle projecting perpendicularly from the first surface of the positioning wheel, and a motor attached to a distal end of the axle.

8. The handler of claim 6 wherein each platform comprises a base, a plurality of sides, a slot in each side wherein the slot is parallel to the base, and an opening through a top of each side wherein the opening intersects the slot.

9. The handler of claim 6 further including a plurality of guide pins projecting perpendicularly from each platform through a plurality of holes that are through the positioning wheel.

10. The handler of claim 6 further including a plurality of guide pins projecting perpendicularly from the positioning wheel through holes that are through the plurality of platforms.

11. The handler of claim 6 wherein the actuator includes a rectangular opening through the actuator and a slot through a side of the opening, the opening having a width that is larger than the diameter of the foot and the slot having a width that is larger than the diameter of the stud so that the stud and foot move through the opening as the positioning wheel rotates.

12. The handler of claim 6 wherein the eccentric actuated drive includes an eccentric wheel within the second opening in the actuator and an axle having a first end attached to the eccentric wheel and a second end attached to a motor, wherein a center line of the axle, a center line of the slot, and a center line of the first opening are in one plane.

13. A method of handling semiconductor devices which comprises:

inserting a semiconductor device into a platform that is located on a positioning wheel;

aligning the device with a tester by rotating the positioning wheel;

elevating the platform from the positioning wheel until the device is contacting the tester;

lowering the platform;

aligning the device with a sorting apparatus by rotating the positioning wheel; and ejecting the device from the platform.

* * * * *

UNITED STATES PATENT AND TRADEMARK OFFICE
CERTIFICATE OF CORRECTION

PATENT NO. : 5,121,052
DATED : June 9, 1992
INVENTOR(S) : Larry A. Nickerson

It is certified that error appears in the above-indentified patent and that said Letters Patent is hereby corrected as shown below:

Column 5, lines 9-10, delete " has been inserted, to distinguish over the prior art"

Signed and Sealed this

First Day of March, 1994

Attest:

BRUCE LEHMAN

*Attesting Officer*   *Commissioner of Patents and Trademarks*